(12) United States Patent
Jung et al.

(10) Patent No.: US 9,142,418 B1
(45) Date of Patent: Sep. 22, 2015

(54) DOUBLE/MULTIPLE FIN STRUCTURE FOR FINFET DEVICES

(71) Applicant: GLOBALFOUNDRIES INC., Grand Cayman, KY (US)

(72) Inventors: InSoo Jung, Malta, NY (US); Wonwoo Kim, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/281,726

(22) Filed: May 19, 2014

(51) Int. Cl.
| | |
|---|---|
| H01L 21/00 | (2006.01) |
| H01L 21/308 | (2006.01) |
| H01L 21/02 | (2006.01) |
| H01L 29/06 | (2006.01) |
| H01L 29/78 | (2006.01) |

(52) U.S. Cl.
CPC ...... *H01L 21/3081* (2013.01); *H01L 21/02532* (2013.01); *H01L 29/0657* (2013.01); *H01L 29/785* (2013.01)

(58) Field of Classification Search
CPC ............ H01L 29/785; H01L 29/66795; H01L 29/78645; H01L 29/78648; H01L 21/84
USPC .................. 438/153, 154, 156, 157, 268, 275
See application file for complete search history.

(56) References Cited

U.S. PATENT DOCUMENTS 7,960,791 B2 * 6/2011 Anderson et al. ............. 257/349
8,420,417 B2 4/2013 Jeong et al.

* cited by examiner

*Primary Examiner* — Quoc Hoang
(74) *Attorney, Agent, or Firm* — Ditthavong & Steiner, P.C.

(57) ABSTRACT

A method of forming double and/or multiple numbers of fins of a FinFET device using a Si/SiGe selective epitaxial growth process and the resulting device are provided. Embodiments include forming a Si pillar in an oxide layer, the Si pillar having a bottom portion and a top portion; removing the top portion of the Si pillar; forming a SiGe pillar on the bottom portion of the Si pillar; reducing the SiGe pillar; forming a first set of Si fins on opposite sides of the reduced SiGe pillar; removing the SiGe pillar; replacing the Si fins with SiGe fins; reducing the SiGe fins; forming a second set of Si fins on opposite sides of the SiGe fins; and removing the SiGe fins.

16 Claims, 20 Drawing Sheets

DOUBLE/MULTIPLE FIN STRUCTURE FOR FINFET DEVICES

TECHNICAL FIELD

The present disclosure relates to a fin formation process for fin-type field-effect transistor (FinFET) devices. The present disclosure is particularly applicable to 14 nanometers (nm) technology nodes and beyond.

BACKGROUND

With the increasing miniaturization of integrated circuits (IC) and increasing higher requirements for ICs, transistors need to have higher drive currents with increasingly smaller dimensions. Doubling or multiplying the number of fins in a FinFET device can double or multiply drive current as compared to a single fin structure. However, forming double or multiple fins is complicated by material and process technology limits.

A need therefore exists for methodology for simply forming double or multiple numbers of fins for FinFET devices, and the resulting device.

SUMMARY

An aspect of the present disclosure is a method of forming double or multiple numbers of fins using a silicon/silicon germanium (Si/SiGe) selective epitaxial growth (SEG) process.

Another aspect of the present disclosure is a FinFET device including double or multiple numbers of fins formed by an SEG process.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming an Si pillar in an oxide layer, the Si pillar having a bottom portion and a top portion; removing the top portion of the Si pillar; forming an SiGe pillar on the bottom portion of the Si pillar; reducing the SiGe pillar; forming a first set of Si fins on opposite sides of the reduced SiGe pillar; removing the SiGe pillar; replacing the Si fins with SiGe fins; reducing the SiGe fins; forming a second set of Si fins on opposite sides of the SiGe fins; and removing the SiGe fins.

Aspects of the present disclosure include removing the top portion of the Si pillar by Si selective etching, forming a trench in the oxide layer. Other aspects include forming the trench to a depth of 20 nm to 100 nm. Further aspects include forming the SiGe pillar by: epitaxially growing SiGe in the trench and extending above a top surface of the oxide layer; and etching the oxide layer down to the bottom portion of the Si pillar. Another aspect includes reducing the SiGe pillar by etching two-thirds of a width of the SiGe pillar and 10 nm to 50 nm of height. Additional aspects include forming the first set of Si fins by: forming a Si layer around the reduced SiGe pillar; forming a second oxide layer over the oxide layer and the Si layer; and planarizing the second oxide layer down to the reduced SiGe pillar. Other aspects include replacing the first set of Si fins with SiGe fins by: etching the second oxide layer down to the bottom portion of the Si pillar; forming a third oxide layer between and around the first set of Si fins; removing the first set of Si fins, forming trenches in the third oxide layer; epitaxially growing SiGe in the trenches; and removing the third oxide layer down to the bottom portion of the Si pillar. Further aspects include forming the second set of Si fins by: forming a second Si layer around the SiGe fins; forming a fourth oxide layer over the first oxide layer and the second Si layer; and planarizing the fourth oxide layer down to a top surface of the SiGe fins. Another aspect includes etching the fourth oxide down to the bottom portion of the Si pillar subsequent to planarizing the fourth oxide layer. Additional aspects include reducing the SiGe fins by etching six-sevenths of the width of the top portion of the Si pillar and 5 nm to 25 nm of height. Other aspects include forming the top portion of the Si pillar to a width of 5 nm to 50 nm.

Another aspect of the present disclosure is a device including: an oxide layer; a Si pillar in the oxide layer; at least two pairs of Si fins formed on a top surface of the Si pillar. Aspects of the device include the number of pairs of Si fins being formed determined by the number of repetitions of a Si/SiGe selective epitaxial growth process. Other aspects include a width of a top surface of the Si pillar being 10 nm to 100 nm. Further aspects include a height of the Si fins being 20 nm to 100 nm.

Another aspect of the present disclosure is a method including: forming a Si pillar in a first oxide layer, the Si pillar having a bottom portion and a top portion formed to a width of 5 nm to 50 nm; forming a first trench in the first oxide layer to a depth of 20 nm to 100 nm by selectively etching the top portion of the Si pillars; forming a first SiGe pillar in the first trench and extending above a top surface of the first oxide layer; etching the first oxide layer down to the bottom portion of the Si pillar; reducing the SiGe pillar; forming a first Si layer on opposite sides of the reduced first SiGe pillar; forming a second oxide on the first oxide, around the first Si layer; etching the reduced first SiGe pillar; etching the second oxide layer down to a top surface of the first oxide layer, leaving a first set of Si fins; forming a third oxide layer between and around the first set of Si fins; etching the Si fins, forming second trenches; forming a second SiGe pillar in each second trench by selective epitaxial growth; etching the third oxide layer down to a top surface of the first oxide layer; reducing the second SiGe pillars; forming a second Si layer on opposite sides of each reduced second SiGe pillar; forming a fourth oxide on the first oxide, around the second Si layer; removing the reduced second SiGe pillars; and etching the fourth oxide layer down to a top surface of the first oxide layer, leaving a second set of Si fins.

Aspects of the present disclosure include forming the first SiGe pillar by epitaxially growing SiGe in the trench to a height above a top surface of the first oxide layer; and reducing the SiGe pillar by etching two-thirds of a width of the SiGe pillar and 10 nm to 50 nm of height. Other aspects include forming the first Si layer on opposite sides of the reduced first SiGe pillar and the second oxide around the first Si layer by: forming the first Si layer over and around the reduced SiGe pillar by Si selective epitaxial growth; forming the second oxide layer over the oxide layer and over the first Si layer; and planarizing the second oxide layer down to the reduced SiGe pillar. Further aspects include, forming the second Si layer on opposite sides of each reduced second SiGe pillar and the fourth oxide around the second Si layer by: forming the second Si layer over and around the reduced second SiGe pillars; forming the fourth oxide layer over the first oxide layer and over the second Si layer; and planarizing the fourth oxide layer down to the reduced second SiGe pillars. Another aspect includes comprising performing one or more times, subsequent to etching the fourth oxide layer, the sequence of: forming an oxide layer between and around a last formed set of Si fins; etching the last formed set Si fins, forming trenches; forming a SiGe pillar in each trench by selective epitaxial growth; etching the oxide layer down to a top surface of the first oxide layer; reducing the SiGe pillars; forming a Si layer on opposite sides of each reduced SiGe pillar; forming another oxide on the first oxide, around the Si layer; removing the reduced SiGe pillars; and etching the another oxide layer down to a top surface of the first oxide layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of complicated material and process technology limits attendant upon forming double or multiple numbers of fins of a FinFet device to increase drive current.

Methodology in accordance with embodiments of the present disclosure includes forming an Si pillar in an oxide layer, the Si pillar having a bottom portion and a top portion. The top portion of the Si pillar is removed, and a SiGe pillar is formed on the bottom portion of the Si pillar. The SiGe pillar is then reduced, and a first set of Si fins is formed on opposite sides of the reduced SiGe pillar. The SiGe pillar is removed, and the Si fins are replaced with SiGe fins. The SiGe fins are reduced, and a second set of Si fins is formed on opposite sides of the SiGe fins. Last, the SiGe fins are removed.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
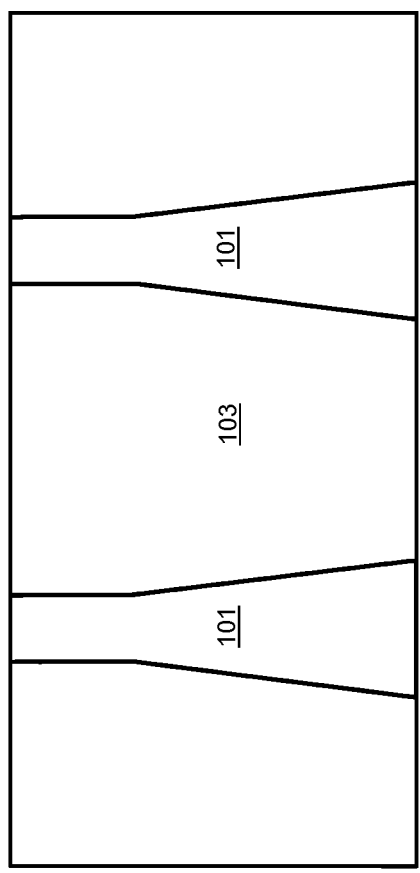
FIGS. 1 through 20 schematically illustrate sequential steps of a method of forming double and/or multiple numbers of fins of a FinFET device using a Si/SiGe SEG process, in accordance with an exemplary embodiment of the present disclosure.
Figure 2:
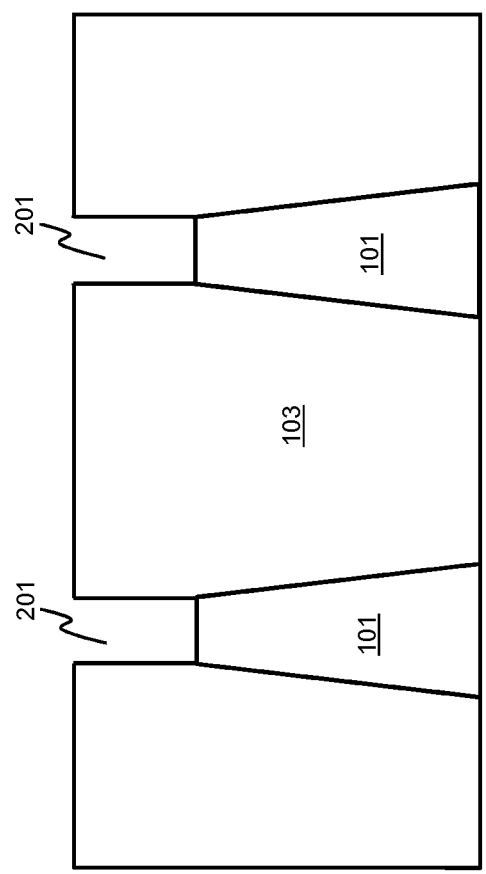
Figure 3:
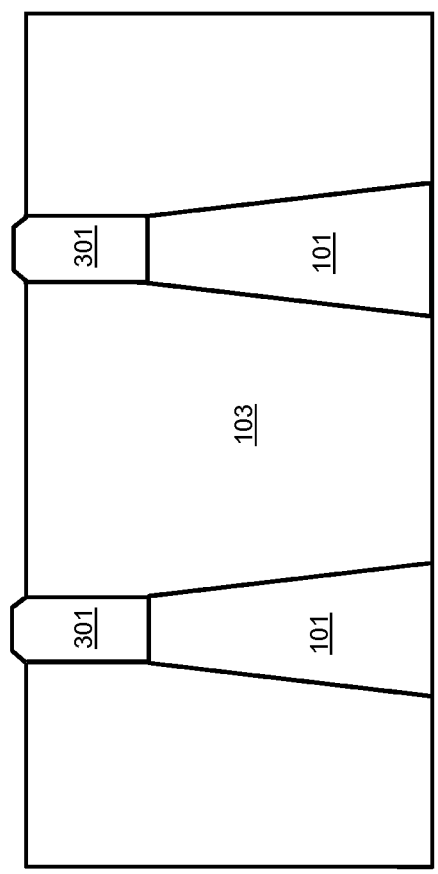
Figure 4:
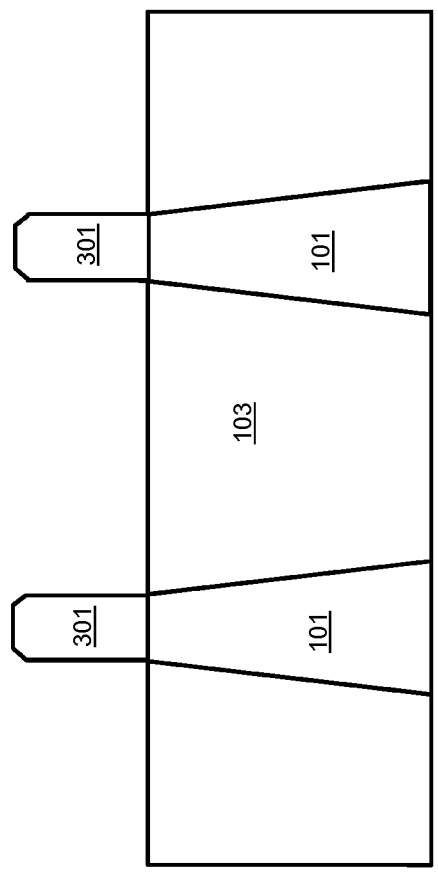
Figure 5:
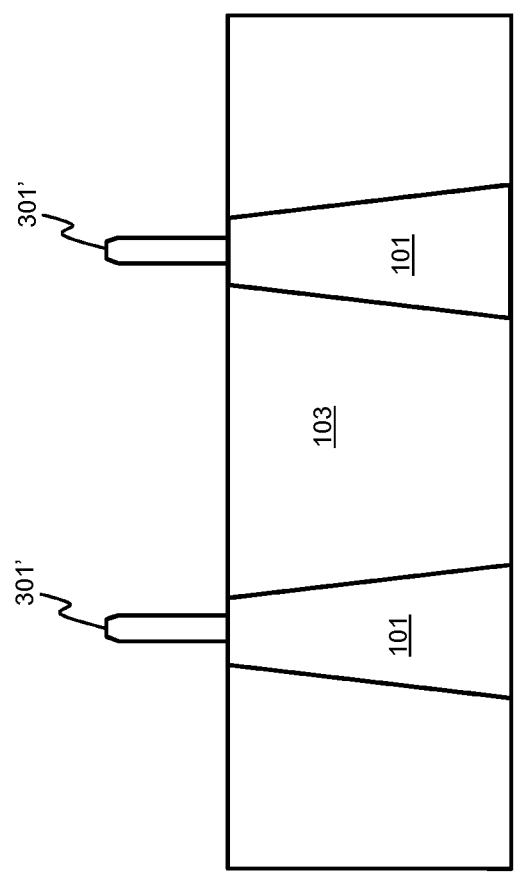

Adverting to FIG. 1, at least one Si pillar 101, having a bottom portion and a top portion, is formed in a shallow trench isolation (STI) layer 103, formed for example of an oxide. The top portion of the Si pillar 101 may, for example, be formed to a width of 5 nm to 50 nm. Next, the top portion of the Si pillar 101 is removed by Si selective etching, forming a trench 201 in the STI layer 103, as depicted in FIG. 2. The trench 201 may, for example, be formed to a depth of 20 nm to 100 nm. The height of the resulting Si fins can be controlled by the depth of the Si selective etching. Adverting to FIG. 3, a SiGe pillar 301 is formed on the bottom portion of the Si pillar 101. The SiGe pillar 301 is formed by epitaxially growing SiGe in the trench 201 until the top surface of the SiGe pillar 301 extends above the top surface of the STI layer 103. Next, the STI layer 103 is etched down to the bottom portion of the Si pillar 101, as depicted in FIG. 4. Thereafter, the SiGe pillar 301 is reduced by etching two-thirds of the width of the SiGe pillar 301 and 10 nm to 50 nm of height, forming the SiGe pillar 301', as illustrated in FIG. 5.

Figure 6:
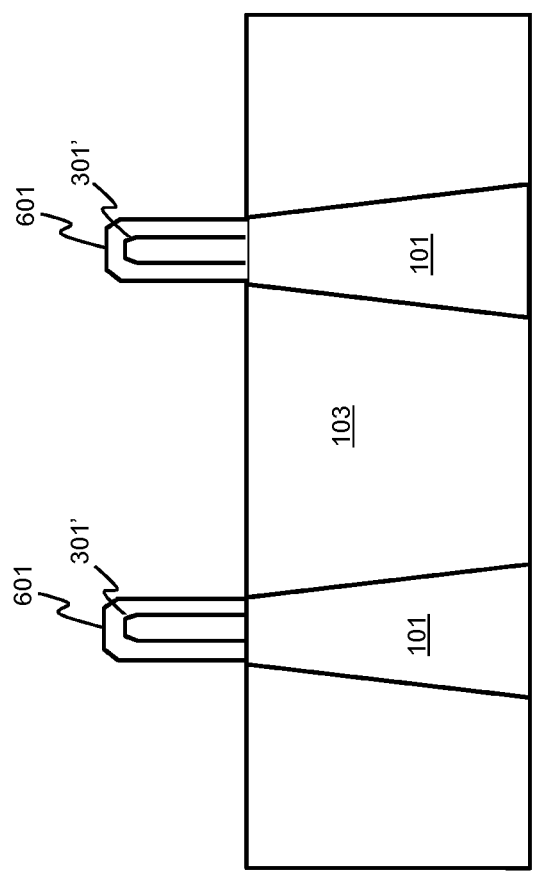
Figure 7:
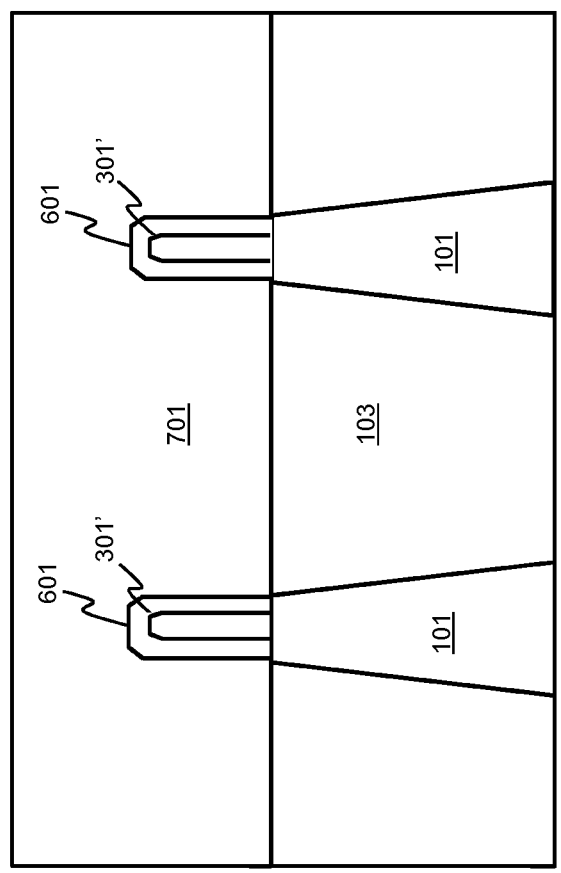
Figure 8:
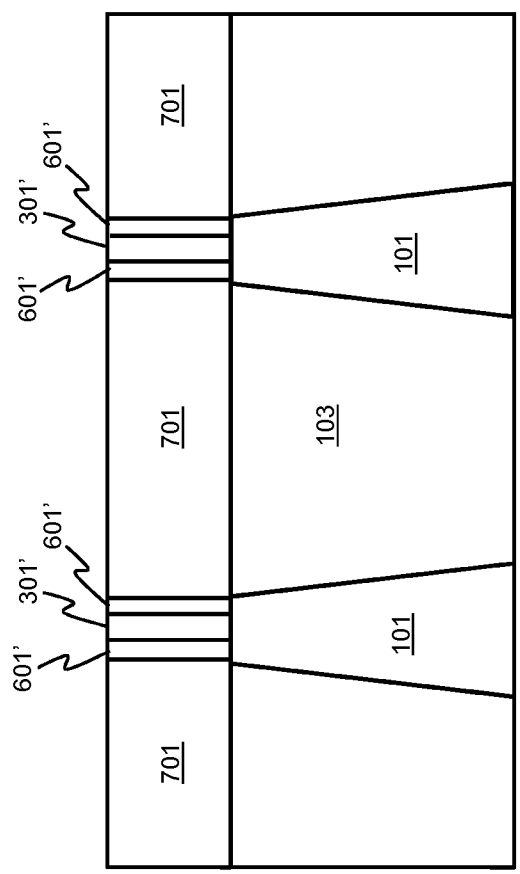
Figure 9:
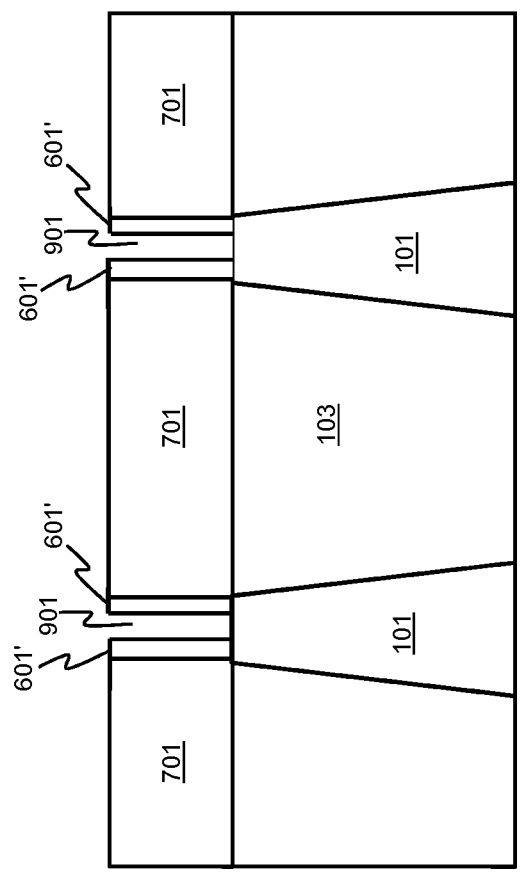
Figure 10:
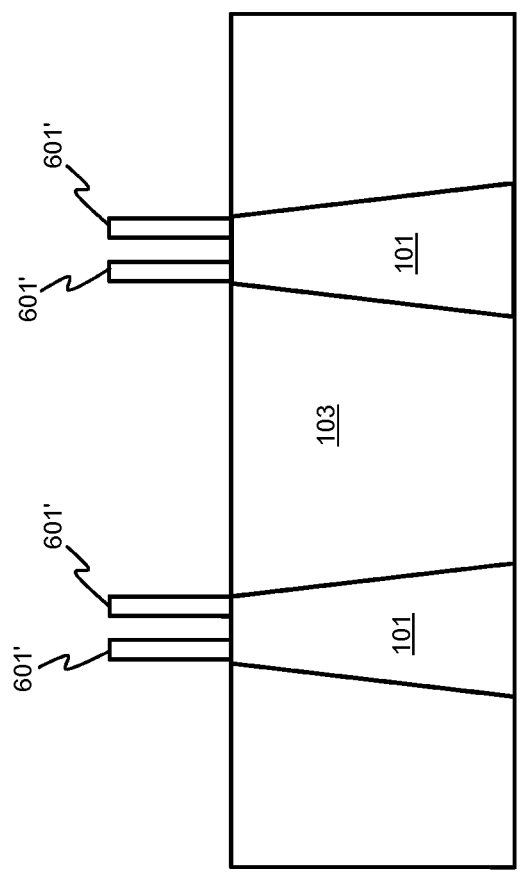

Adverting to FIG. 6, a Si layer 601 is formed around the reduced SiGe pillar 301'. The Si layer 601 is formed around the SiGe pillar 301 by Si selective epitaxial growth. For example, the Si layer 601 may be grown to a thickness of one-third of the width of the top portion of the Si pillar 101. The resulting Si fin width can be controlled by the Si selective epitaxial growth thickness and the width of the original Si pillar 101. Next, an STI layer 701, e.g., of oxide, is formed over the STI layer 103 and the Si layer 601, as depicted in FIG. 7. Thereafter, the STI layer 701 is planarized, e.g., by CMP, down to the SiGe pillar 301', as depicted in FIG. 8. In particular, an initial CMP may stop at the surface of the Si layer 601, and then an over-CMP can be performed down to the SiGe pillar 301'. Moreover, the planarization of the STI layer 701 reduces the Si layer 601 to a set of Si fins 601'. Adverting to FIG. 9, the SiGe pillar 301' is removed, e.g., by selective etching. Thereafter, the remaining STI layer 701 is etched down to the bottom portion of the Si pillar 101, exposing the set of Si fins 601', as depicted in FIG. 10.

Figure 11:
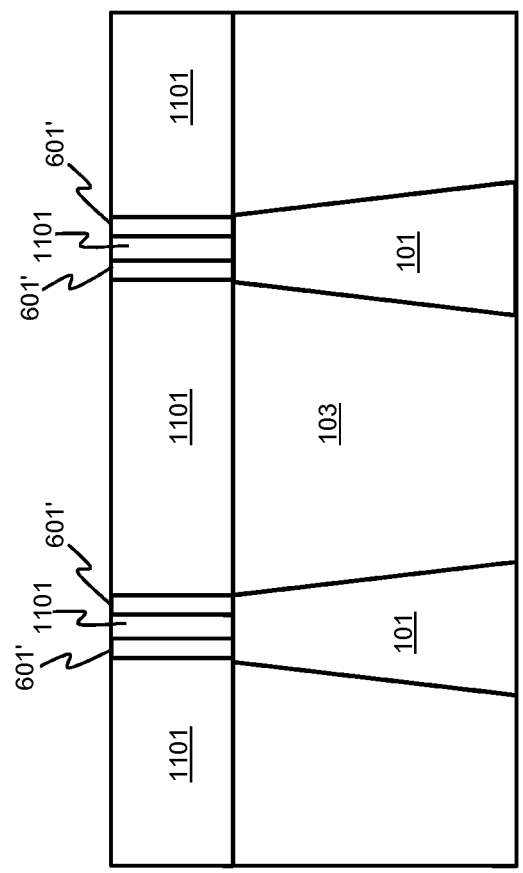
Figure 12:
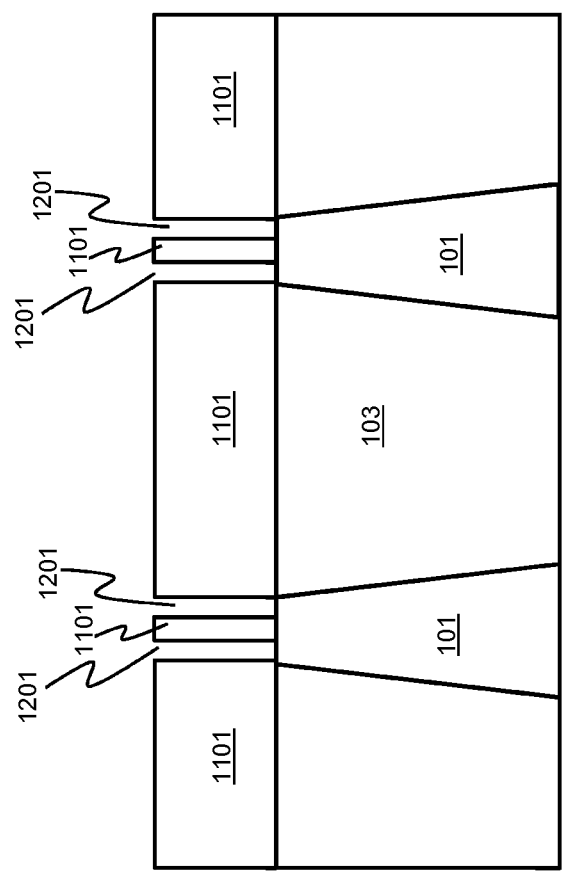
Figure 13:
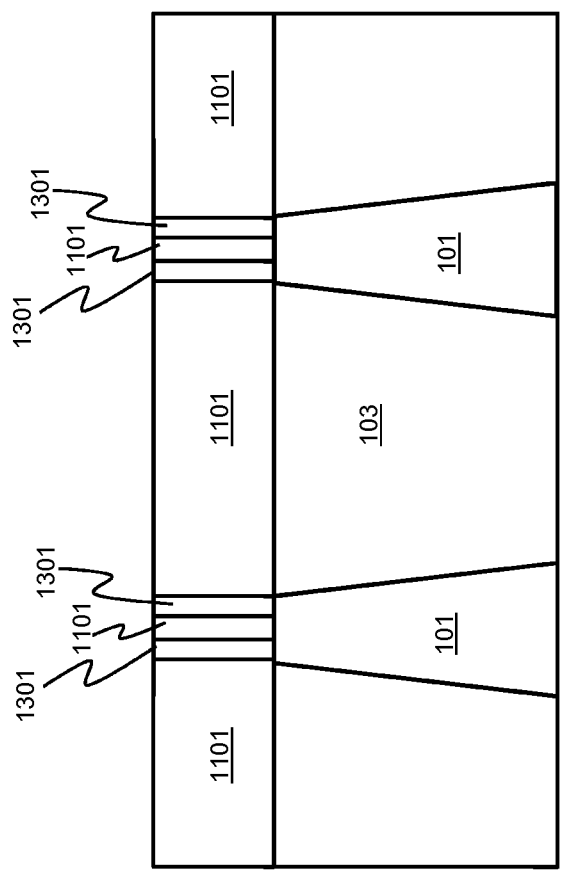
Figure 14:
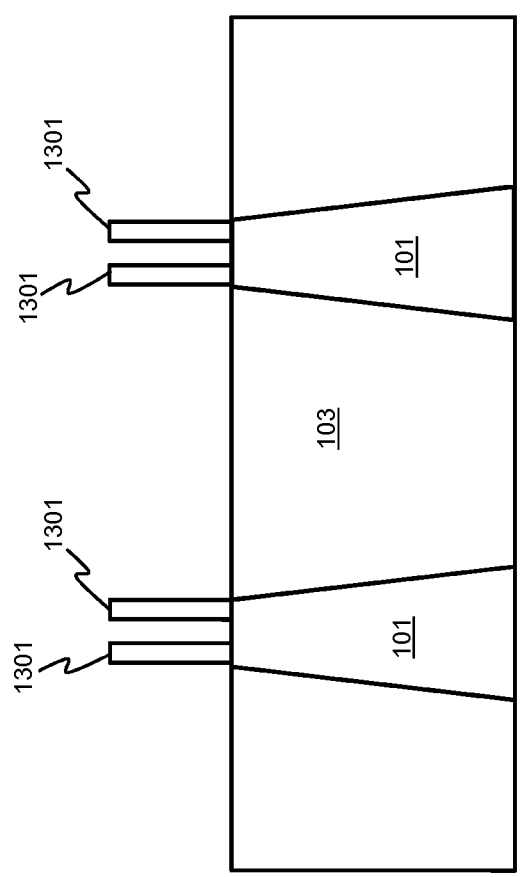
Figure 15:
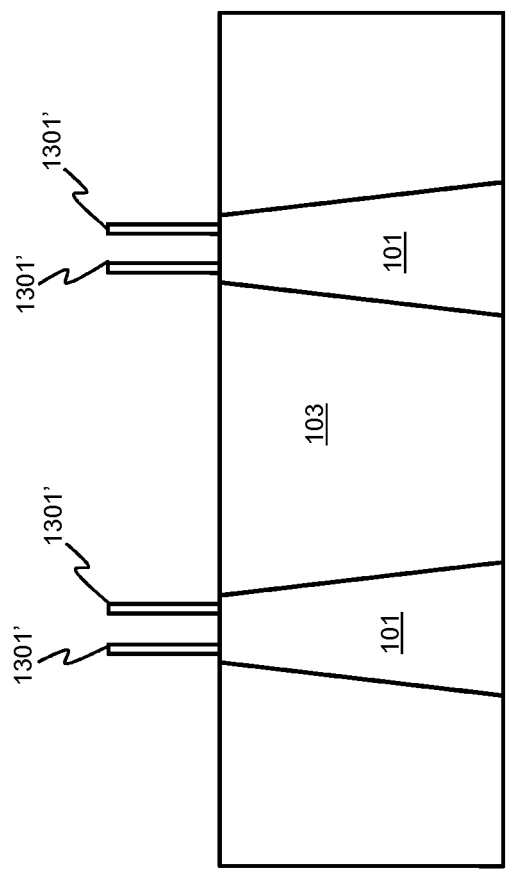

Adverting to FIG. 11, an oxide layer 1101 is formed on top of the STI layer 103 and between the set of Si fins 601'. The oxide layer 1101 is then planarized, e.g., by CMP, down to the top of the set of Si fins 601'. Next, the set of Si fins 601' are removed by a recess etch, for example, forming trenches 1201, as depicted in FIG. 12. More specifically, the etch rate selectivity to Si can be controlled by the percentage of Ge content within the SiGe, which may, for example, range from 15% to 50%. Adverting to FIG. 13, SiGe 1301 is grown in the trenches 1201 by SEG. Next, the oxide layer 1101 is etched down to the bottom portion of the Si pillar 101. Thereafter, the SiGe 1301 is reduced by etching six-sevenths of a width of the Si pillar 101 and 5 nm to 25 nm of height, forming a set of SiGe fins 1301', as depicted in FIG. 15.

Figure 16:
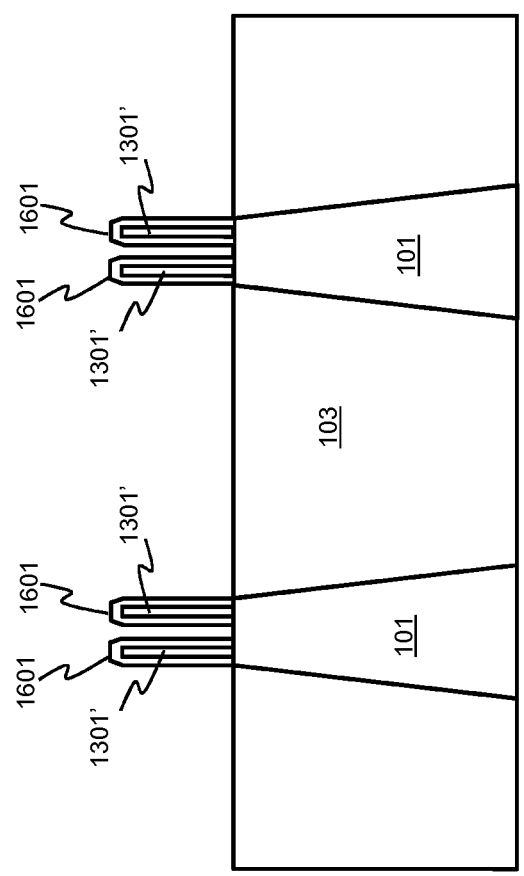
Figure 17:
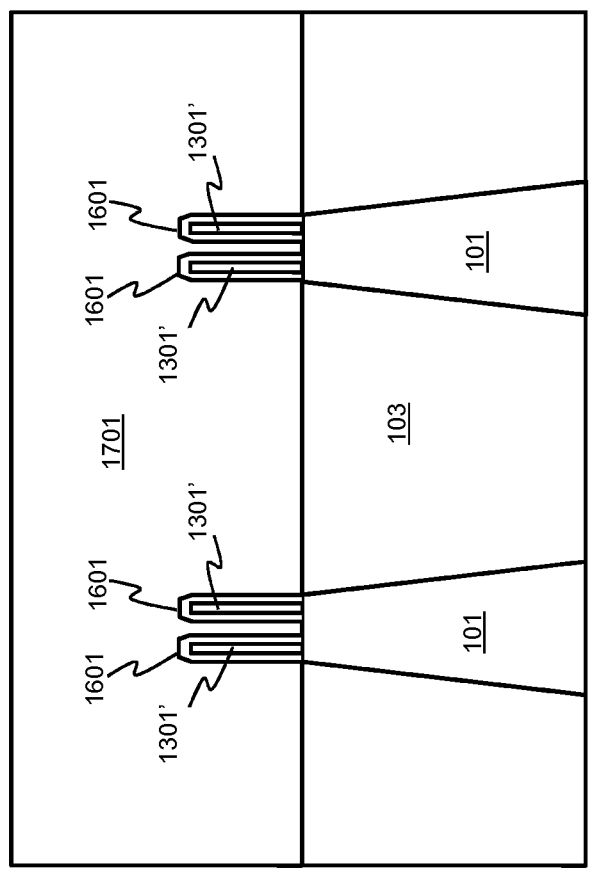
Figure 18:
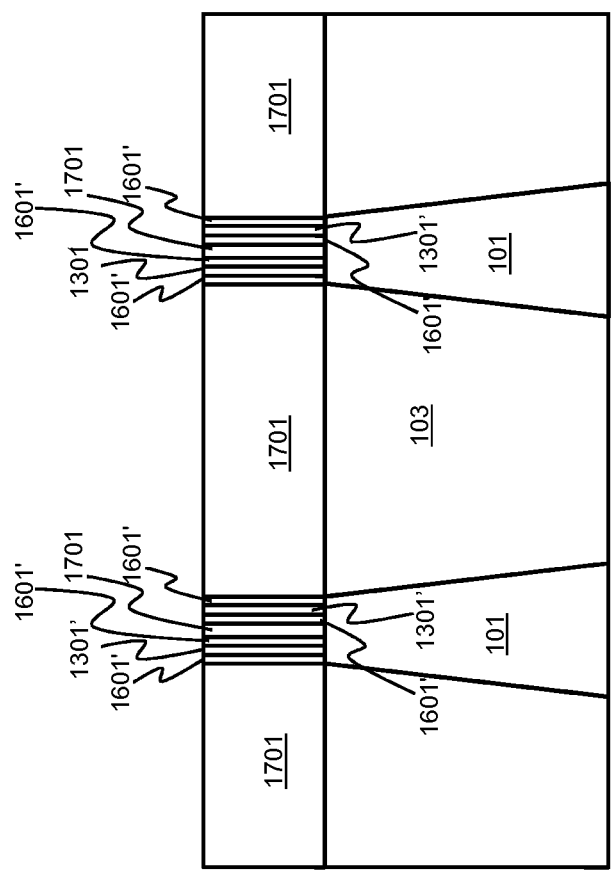
Figure 19:
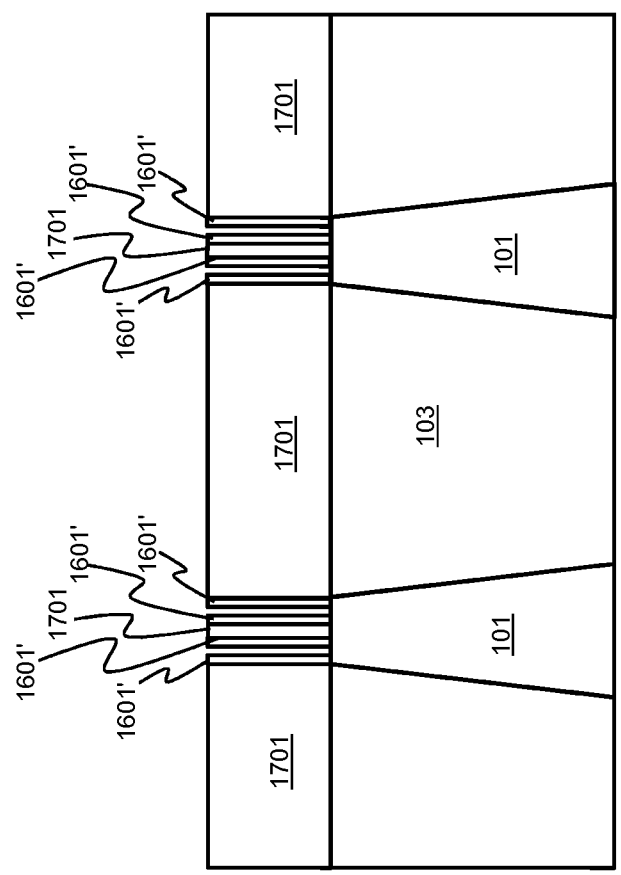
Figure 20:
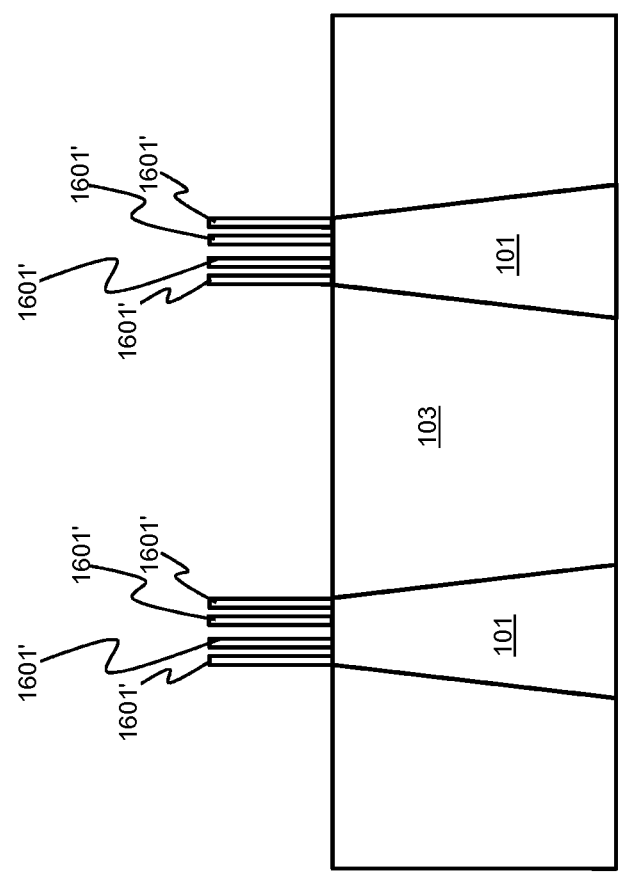

Similar to FIG. 6, a Si layer 1601 is grown around the SiGe fins 1301' by SEG, as depicted in FIG. 16. Growing the Si layer 1601 to a thickness of one-seventh of the width of the Si pillar 101, for example, will subsequently produce equi-distant multiple Si fins. Next, an oxide layer 1701 is formed over the STI layer 103 and the Si layer 1601, as depicted in FIG. 17. Thereafter, the oxide layer 1701 is planarized, e.g., by CMP, down to the SiGe fins 1301'. Again, the CMP may first stop on the Si layer 1601, and then over-CMP can be performed down to the SiGe fins 1301', as depicted in FIG. 18. The planarizing of the oxide layer 1701 reduces the Si layer 1601 into multiple Si fins 1601'. Adverting to FIG. 19, the SiGe fins 1301' are removed by etching down to the bottom portion of the Si pillar 101. The oxide layer 1701 is then etched down the bottom portion of the Si pillar 101, exposing the multiple Si fins 1601', as depicted in FIG. 20.

In addition, subsequent to the etching of the oxide layer 1701, the steps depicted in FIGS. 11 through 20 may be repeated one or more times (not shown for illustrative convenience) to further increase the number of Si fins. In particular, the number of resulting Si fins can be defined by the repetition frequency of the SiGe and subsequent Si selective epitaxial growth processes.

The embodiments of the present disclosure can achieve several technical effects including simply forming double or multiple fins for FinFet devices without complicated material and process technology limits. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure is particularly applicable to 14 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a silicon (Si) pillar in an oxide layer, the Si pillar having a bottom portion and a top portion;
   removing the top portion of the Si pillar;
   forming a silicon germanium (SiGe) pillar on the bottom portion of the Si pillar;
   reducing the SiGe pillar;
   forming a first set of Si fins on opposite sides of the reduced SiGe pillar;
   removing the SiGe pillar;
   replacing the Si fins with SiGe fins;
   reducing the SiGe fins;
   forming a second set of Si fins on opposite sides of the SiGe fins; and
   removing the SiGe fins.

2. The method according to claim 1, comprising removing the top portion of the Si pillar by Si selective etching, forming a trench in the oxide layer.

3. The method according to claim 2, comprising forming the trench to a depth of 20 nanometers (nm) to 100 nm.

4. The method according to claim 2, comprising forming the SiGe pillar by:
   epitaxially growing SiGe in the trench and extending above a top surface of the oxide layer; and
   etching the oxide layer down to the bottom portion of the Si pillar.

5. The method according to claim 4, comprising reducing the SiGe pillar by etching two-thirds of a width of the SiGe pillar and 10 nm to 50 nm of height.

6. The method according to claim 4, comprising forming the first set of Si fins by:
   forming a Si layer around the reduced SiGe pillar;
   forming a second oxide layer over the oxide layer and the Si layer; and
   planarizing the second oxide layer down to the reduced SiGe pillar.

7. The method according to claim 6, comprising replacing the first set of Si fins with SiGe fins by:
   etching the second oxide layer down to the bottom portion of the Si pillar;
   forming a third oxide layer between and around the first set of Si fins;
   removing the first set of Si fins, forming trenches in the third oxide layer;
   epitaxially growing SiGe in the trenches; and
   removing the third oxide layer down to the bottom portion of the Si pillar.

8. The method according to claim 7, comprising forming the second set of Si fins by:
   forming a second Si layer around the reduced SiGe fins;
   forming a fourth oxide layer over the first oxide layer and the second Si layer; and
   planarizing the fourth oxide layer down to a top surface of the reduced SiGe fins.

9. The method according to claim 8, further comprising etching the fourth oxide down to the bottom portion of the Si pillar subsequent to planarizing the fourth oxide layer.

10. The method according to claim 1, comprising reducing the SiGe fins by etching six-sevenths of the width of the top portion of the Si pillar and 5 nm to 25 nm of height.

11. The method according to claim 1, comprising forming the top portion of the Si pillar to a width of 5 nm to 50 nm.

12. A method comprising:
   forming a Si pillar in a first oxide layer, the Si pillar having a bottom portion and a top portion formed to a width of 5 nanometers (nm) to 50 nm;
   forming a first trench in the first oxide layer to a depth of 20 nm to 100 nm by selectively etching the top portion of the Si pillars;
   forming a first silicon germanium (SiGe) pillar in the first trench and extending above a top surface of the first oxide layer;
   etching the first oxide layer down to the bottom portion of the Si pillar;
   reducing the SiGe pillar:
   forming a first Si layer on opposite sides of the reduced first SiGe pillar;
   forming a second oxide on the first oxide, around the first Si layer;
   etching the reduced first SiGe pillar;
   etching the second oxide layer down to a top surface of the first oxide layer, leaving a first set of Si fins;
   forming a third oxide layer between and around the first set of Si fins;
   etching the Si fins, forming second trenches;
   forming a second SiGe pillar in each second trench by selective epitaxial growth;
   etching the third oxide layer down to a top surface of the first oxide layer;
   reducing the second SiGe pillars;
   forming a second Si layer on opposite sides of each reduced second SiGe pillar;
   forming a fourth oxide on the first oxide, around the second Si layer;
   removing the reduced second SiGe pillars; and etching the fourth oxide layer down to a top surface of the first oxide layer, leaving a second set of Si fins.

13. The method according to claim 12, comprising:
   forming the first SiGe pillar by epitaxially growing SiGe in the trench to a height above a top surface of the first oxide layer; and
   reducing the SiGe pillar by etching two-thirds of a width of the SiGe pillar and 10 nm to 50 nm of height.

14. The method according to claim 12, comprising forming the first Si layer on opposite sides of the reduced first SiGe pillar and the second oxide around the first Si layer by:
   forming the first Si layer over and around the reduced SiGe pillar by Si selective epitaxial growth;
   forming the second oxide layer over the oxide layer and over the first Si layer; and
   planarizing the second oxide layer down to the reduced SiGe pillar.

15. The method according to claim 12, comprising forming the second Si layer on opposite sides of each reduced second SiGe pillar and the fourth oxide around the second Si layer by:
   forming the second Si layer over and around the reduced second SiGe pillars;
   forming the fourth oxide layer over the first oxide layer and over the second Si layer; and
   planarizing the fourth oxide layer down to the reduced second SiGe pillars.

16. The method according to claim 12, further comprising performing one or more times, subsequent to etching the fourth oxide layer, the sequence of:
   forming an oxide layer between and around a last formed set of Si fins;
   etching the last formed set Si fins, forming trenches;
   forming a SiGe pillar in each trench by selective epitaxial growth;
   etching the oxide layer down to a top surface of the first oxide layer;
   reducing the SiGe pillars;
   forming a Si layer on opposite sides of each reduced SiGe pillar;
   forming another oxide on the first oxide, around the Si layer;
   removing the reduced SiGe pillars; and
   etching the another oxide layer down to a top surface of the first oxide layer.

* * * * *